United States Patent
Izumi

(10) Patent No.: US 8,174,066 B2
(45) Date of Patent: May 8, 2012

(54) SEMICONDUCTOR DEVICE AND METHOD OF MANUFACTURING SEMICONDUCTOR DEVICE

(75) Inventor: Naoki Izumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 302 days.

(21) Appl. No.: 12/222,461

(22) Filed: Aug. 8, 2008

(65) Prior Publication Data
US 2009/0283823 A1 Nov. 19, 2009

(30) Foreign Application Priority Data

Aug. 10, 2007 (JP) .................................. 2007-209808
May 12, 2008 (JP) .................................. 2008-125139

(51) Int. Cl.
*H01L 29/66* (2006.01)

(52) U.S. Cl. ........ 257/332; 438/137; 438/138; 438/270; 257/330; 257/331; 257/E29.262

(58) Field of Classification Search ........... 257/E29.262, 257/E21.41, 330–334, 374, 397, 513–514, 257/622, 647–648, 135, 302, E21.018, E21.036, 257/E21.375, E21.418, E21.447, E21.629; 438/270, 137–138
See application file for complete search history.

(56) References Cited

U.S. PATENT DOCUMENTS

| | | | | |
|---|---|---|---|---|
| 4,672,410 A | * | 6/1987 | Miura et al. | 257/302 |
| 4,689,656 A | * | 8/1987 | Silvestri et al. | 257/513 |
| 4,729,964 A | * | 3/1988 | Natsuaki et al. | 438/220 |
| 4,754,310 A | * | 6/1988 | Coe | 257/287 |
| 4,819,052 A | * | 4/1989 | Hutter | 257/378 |
| 4,833,094 A | * | 5/1989 | Kenney | 438/243 |
| 4,980,747 A | * | 12/1990 | Hutter et al. | 257/513 |
| 5,008,719 A | * | 4/1991 | Schrantz | 257/261 |
| 5,241,210 A | * | 8/1993 | Nakagawa et al. | 257/487 |
| 5,334,548 A | * | 8/1994 | Shen et al. | 438/246 |
| 5,341,011 A | * | 8/1994 | Hshieh et al. | 257/330 |
| 5,532,179 A | * | 7/1996 | Chang et al. | 438/270 |
| 5,689,121 A | * | 11/1997 | Kitagawa et al. | 257/139 |
| 5,801,408 A | * | 9/1998 | Takahashi | 257/212 |
| 5,856,701 A | * | 1/1999 | Ronsisvalle | 257/520 |

(Continued)

FOREIGN PATENT DOCUMENTS

JP 2005-235913 9/2005

(Continued)

*Primary Examiner* — Fernando L Toledo
*Assistant Examiner* — Ankush Singal
(74) *Attorney, Agent, or Firm* — Rabin & Berdo, P.C.

(57) ABSTRACT

A semiconductor device includes: a semiconductor layer; a first conductivity type region of a first conductivity type formed in a base layer portion of the semiconductor layer; a body region of a second conductivity type formed in the semiconductor layer to be in contact with the first conductivity type region; a trench formed by digging the semiconductor layer from the surface thereof to pass through the body region so that the deepest portion thereof reaches the first conductivity type region; a gate insulating film formed on the bottom surface and the side surface of the trench; a gate electrode buried in the trench through the gate insulating film; a source region of the first conductivity type formed in a surface layer portion of the semiconductor layer on a side in a direction orthogonal to the gate width with respect to the trench to be in contact with the body region; and a high-concentration region of the second conductivity type, formed in the body region on a position opposed to the trench in the direction orthogonal to the gate width, having a higher second conductivity type impurity concentration than that of the periphery thereof.

12 Claims, 18 Drawing Sheets

U.S. PATENT DOCUMENTS

| | | | |
|---|---|---|---|
| 6,172,398 B1 * | 1/2001 | Hshieh | 257/330 |
| 6,184,555 B1 * | 2/2001 | Tihanyi et al. | 257/342 |
| 6,262,470 B1 * | 7/2001 | Lee et al. | 257/565 |
| 6,337,499 B1 * | 1/2002 | Werner | 257/329 |
| 6,396,113 B1 * | 5/2002 | Fujinaga et al. | 257/397 |
| 6,525,373 B1 * | 2/2003 | Kim | 257/330 |
| 6,696,717 B2 * | 2/2004 | Chang et al. | 257/301 |
| 6,700,175 B1 * | 3/2004 | Kodama et al. | 257/489 |
| 6,710,406 B2 * | 3/2004 | Mo et al. | 257/341 |
| 6,768,167 B2 * | 7/2004 | Nagaoka et al. | 257/329 |
| 6,897,493 B2 * | 5/2005 | Takahashi et al. | 257/136 |
| 7,224,022 B2 * | 5/2007 | Tokano et al. | 257/328 |
| 7,226,841 B2 * | 6/2007 | Izumisawa et al. | 438/272 |
| 7,423,316 B2 * | 9/2008 | Kawaji et al. | 257/330 |
| 7,553,740 B2 * | 6/2009 | Sharp et al. | 438/424 |
| 2004/0021173 A1 * | 2/2004 | Sapp | 257/330 |
| 2005/0017294 A1 * | 1/2005 | Takemori et al. | 257/330 |
| 2006/0208314 A1 * | 9/2006 | Kaneko | 257/330 |
| 2008/0142799 A1 * | 6/2008 | Kaneko | 257/49 |
| 2009/0096018 A1 * | 4/2009 | Izumi | 257/328 |

FOREIGN PATENT DOCUMENTS

| | | |
|---|---|---|
| JP | 2007-059805 | 3/2007 |

* cited by examiner

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing the same.

2. Description of Related Art

A trench gate structure is generally known as a structure effective for refinement of a VDMOSFET (Vertical Double diffused Metal Oxide Semiconductor Field-Effect Transistor).

FIG. 9 is a schematic sectional view of a conventional semiconductor device 101 including a trench gate VDMOSFET.

This semiconductor device 101 includes an $N^+$-type substrate 102. An $N^-$-type epitaxial layer 103 is laminated on the $N^+$-type substrate 102. An $N^-$-type region 104 is formed on a base layer portion of the $N^-$-type epitaxial layer 103, while a $P^-$-type body region 105 is formed on a surface layer portion of the $N^-$-type epitaxial layer 103 vertically adjacently to the $N^-$-type region 104.

A trench 106 is formed by digging the $N^-$-type epitaxial layer 103 from the surface thereof. The trench 106 passes through the $P^-$-type body region 105, so that the deepest portion thereof reaches the $N^-$-type region 104. A gate electrode 108 made of polysilicon doped with an N-type impurity in a high concentration is buried in the trench 106 through a gate insulating film 107.

An $N^+$-type source region 109 is formed on a surface layer portion of the $P^-$-type body region 105 along the trench 106. A $P^+$-type source contact region 110 is formed in the $N^+$-type source region 109 to pass through the $N^+$-type source region 109.

An interlayer dielectric film 111 is laminated on the $N^-$-type epitaxial layer 103. A source wire 112 is formed on the interlayer dielectric film 111. This source wire 112 is grounded. The source wire 112 is in contact (electrically connected) with the $N^+$-type source region 109 and the $P^+$-type source contact region 110 through a contact hole 113 formed in the interlayer dielectric film 111. A gate wire 114 is electrically connected to the gate electrode 108 through a contact hole (not shown) formed in the interlayer dielectric film 111.

A drain electrode 115 is formed on the back surface of the $N^+$-type substrate 102.

A current can be flowed between the $N^+$-type source region 109 and the drain electrode 115 by controlling the potential of the gate electrode 108 while applying a positive voltage of a proper level to the drain electrode 115 thereby forming a channel in the vicinity of the interface between the $P^-$-type body region 105 and the gate insulating film 107.

The $P^-$-type body region 105 is formed by implanting (ions of) a P-type impurity into the $N^-$-type epitaxial layer 103 from the surface thereof and thereafter drive-in-diffusing the P-type impurity. Therefore, the $P^-$-type body region 105 has an extremely low P-type impurity concentration in the vicinity of the interface between the same and the $N^-$-type region 104. Thus, a depletion layer easily extends toward the $N^+$-type source region 109, and hence the trench 106 must be deeply formed in order to prevent the so-called punch-through.

When the trench 106 is deeply formed, however, crystal defects resulting from remarkable stress may be caused around the upper and lower ends of the trench 106.

SUMMARY OF THE INVENTION

An object of the present invention is to provide a semiconductor device having a structure capable of improving the withstand voltage and reducing the depth of a trench and a method of manufacturing the same.

A semiconductor device of the present invention includes: a semiconductor layer; a first conductivity type region of a first conductivity type formed in a base layer portion of the semiconductor layer; a body region of a second conductivity type formed in the semiconductor layer to be in contact with the first conductivity type region; a trench formed by digging the semiconductor layer from the surface thereof to pass through the body region so that the deepest portion thereof reaches the first conductivity type region; a gate insulating film formed in the bottom surface and the side surface of the trench; a gate electrode buried in the trench through the gate insulating film; a source region of the first conductivity type formed in a surface layer portion of the semiconductor layer on a side in a direction orthogonal to the gate width with respect to the trench to be in contact with the body region; and a high-concentration region of the second conductivity type, formed in the body region on a position opposed to the trench in the direction orthogonal to the gate width, having a higher second conductivity type impurity concentration than that of the periphery thereof.

According to this structure, the first conductivity type region is formed in the base layer portion of the semiconductor layer, and the body region of the second conductivity type is formed in contact with the first conductivity type region. The trench in which the gate electrode is buried through the gate insulating film is formed by digging the semiconductor layer from the surface thereof, to pass through the body region so that the deepest portion thereof reaches the first conductivity type region. In the surface layer portion of the semiconductor layer, the source region of the first conductivity type is formed on the side in the direction orthogonal to the gate width with respect to the trench. Thus, the semiconductor device includes a trench gate VDMOSFET formed by the first conductivity type region as a drain region, the body region, the source region, the gate insulating film and the gate electrode. In the body region, the high-concentration having a higher second conductivity type impurity concentration than that of the periphery thereof is formed on the position opposed to the trench in the direction orthogonal to the gate width.

The high-concentration region is so formed that a depletion layer can be inhibited from extending toward the source region, whereby the withstand voltage can be improved. Consequently, the depth of the trench can be reduced. The depth of the trench is so reduced that portions around the upper and lower ends of the trench can be prevented from application of remarkable stress, whereby formation of crystal defects resulting from stress can be prevented. Further, channel resistance can be reduced, whereby on-resistance of the semiconductor device can be reduced.

Preferably, the semiconductor device further includes a channel implant region containing a first conductivity type impurity formed in the body region between the trench and the high-concentration region. When this channel implant region is formed, the threshold voltage can be controlled by adjusting the quantity of the first conductivity type impurity contained in the channel implant region.

Preferably, the high-concentration region is formed adjacently to the side surface of the trench.

In the trench gate VDMOSFET, a depletion layer easily spreads along the sidewall of the trench to cause a punch-through between the first conductivity type region and the source region in an off state when a portion of the body region around the interface between the same and the gate insulating film, i.e., a portion of the body region around the side surface of the trench has a low impurity concentration.

When the high-concentration region is formed on the portion (forming a channel) adjacent to the side surface of the trench as described above, the depletion layer can be inhibited from spreading along the sidewall of the trench. Therefore, occurrence of a punch-through between the first conductivity type region and the source region can be suppressed.

Preferably, the high-concentration region is formed under the source region to be closer to the trench than the center of the source region in the direction orthogonal to the gate width. Also according to this structure, the depletion layer can be inhibited from spreading along the sidewall of the trench. Therefore, occurrence of a punch-through between the first conductivity type region and the source region can be suppressed.

Preferably, a contact region of the second conductivity type passing through the source region to come into contact with the body region is formed in the surface layer portion of the semiconductor layer, and the high-concentration region is formed under the contact region.

According to this structure, the contact region of the second conductivity type passing through the source region to come into contact with the body region is formed in the surface layer portion of the semiconductor layer. The high-concentration region is formed under this contact region.

Therefore, when a high counter electromotive voltage is applied to the vertical MOSFET formed by the first conductivity type region, the gate electrode and the source region of the first conductivity type due to a flyback voltage generated at a turn-off time in an inductive load, for example, an avalanche current flows from the first conductivity type region to the contact region through the high-concentration region. Thus, a parasitic bipolar transistor formed by the first conductivity type region, the body region and the source region can be prevented from entering an on state, thereby preventing thermal breakdown (avalanche breakdown) resulting from the on state of the parasitic bipolar transistor. Consequently, the avalanche resistance can be improved.

Preferably, half of the high-concentration region farther from the trench in the direction orthogonal to the gate width is arranged under the contact region.

Also according to this structure, an avalanche current flows from the first conductivity type region to the contact region through the high-concentration region when a high counter electromotive voltage is applied to the vertical MOSFET formed by the first conductivity type region, the gate electrode and the source region of the first conductivity type due to a flyback voltage generated at a turn-off time in an inductive load, for example. Thus, the parasitic bipolar transistor formed by the first conductivity type region, the body region and the source region can be prevented from entering an on state, thereby preventing thermal breakdown (avalanche breakdown) resulting from the on state of the parasitic bipolar transistor. Consequently, the avalanche resistance can be improved.

The high-concentration region may be formed in the same width as the contact region in the direction orthogonal to the gate width, and may be entirely arranged under the contact region.

A method of manufacturing a semiconductor device of the present invention includes: a trench forming step of forming a trench by digging a semiconductor layer of a first conductivity type from the surface thereof; a first implantation step of implanting an impurity of a second conductivity type into the semiconductor layer from the side surface of the trench at an implantation angle inclined with respect to the surface of the semiconductor layer; a second implantation step of implanting an impurity of the second conductivity type into the semiconductor layer from the surface of the semiconductor layer; a step of forming a body region of the second conductivity type on a side portion of the trench while forming a high-concentration region of the second conductivity type having a higher second conductivity type impurity concentration than that of the periphery thereof in a position of the body region opposed to the trench in the width direction of the trench by heat-treating the semiconductor layer and diffusing the impurities implanted in the first implantation step and the second implantation step; a third implantation step of implanting an impurity of the first conductivity type into the periphery of the trench from the surface of the semiconductor layer for forming a source region of the first conductivity type in contact with the body region; a fourth implantation step of implanting an impurity of the second conductivity type into the source region from the surface of the semiconductor layer for forming a contact region of the second conductivity type passing through the source region to come into contact with the body region; a step of forming a gate insulating film on the bottom surface and the side surface of the trench; and a step of burying a gate electrode in the trench through the gate insulating film.

According to this method, the impurity of the second conductivity type is implanted into the semiconductor layer from the side surface of the trench at the implantation angle inclined with respect to the surface of the semiconductor layer. Therefore, the high-concentration region can be formed in the position of the body region opposed to the trench in the direction orthogonal to the gate width. Consequently, a semiconductor device capable of improving the withstand voltage and reducing the depth of the trench can be provided.

Preferably, the impurity of the second conductivity type is implanted at an implantation angle of not less than 18° with respect to the surface of the semiconductor layer in the first implantation step. Thus, the high-concentration region can be formed on a portion adjacent to the side surface of the trench. Consequently, a semiconductor device capable of suppressing occurrence of a punch-through between the first conductivity type region and the source region can be provided. Further, the high-concentration region can be formed under the portion where the contact region is formed, and a semiconductor device capable of improving avalanche resistance can be provided in this case.

Preferably, the impurity of the second conductivity type is implanted into the side surface of the trench and a portion adjacent to the side surface in the first implantation step.

Even if the impurity of the second conductivity type contained in the side surface of the trench or the portion adjacent to the side surface is drawn into the gate insulating film when the impurity of the second conductivity type is diffused, the second conductivity type impurity concentration around the side surface can be kept generally identical to the second conductivity type impurity concentration of at least the periphery (excluding the high-concentration region) thereof according to this method. Further, the high-concentration region can be formed on the portion adjacent to the side surface. Consequently, a semiconductor device capable of suppressing occurrence of a punch-through can be provided.

Preferably, the impurity of the second conductivity type is implanted while increasing the acceleration thereof stepwise in the first implantation step. Thus, the impurity can be implanted into a plurality of positions having different distances from the trench in the direction orthogonal to the gate width. Consequently, the width of the high-concentration region in this direction can be increased to be identical to the width of the contact region in this direction, for example.

The foregoing and other objects, features and effects of the present invention will become more apparent from the following detailed description of the preferred embodiments with reference to the attached drawings.

DETAILED DESCRIPTION OF THE INVENTION

Figure 1:
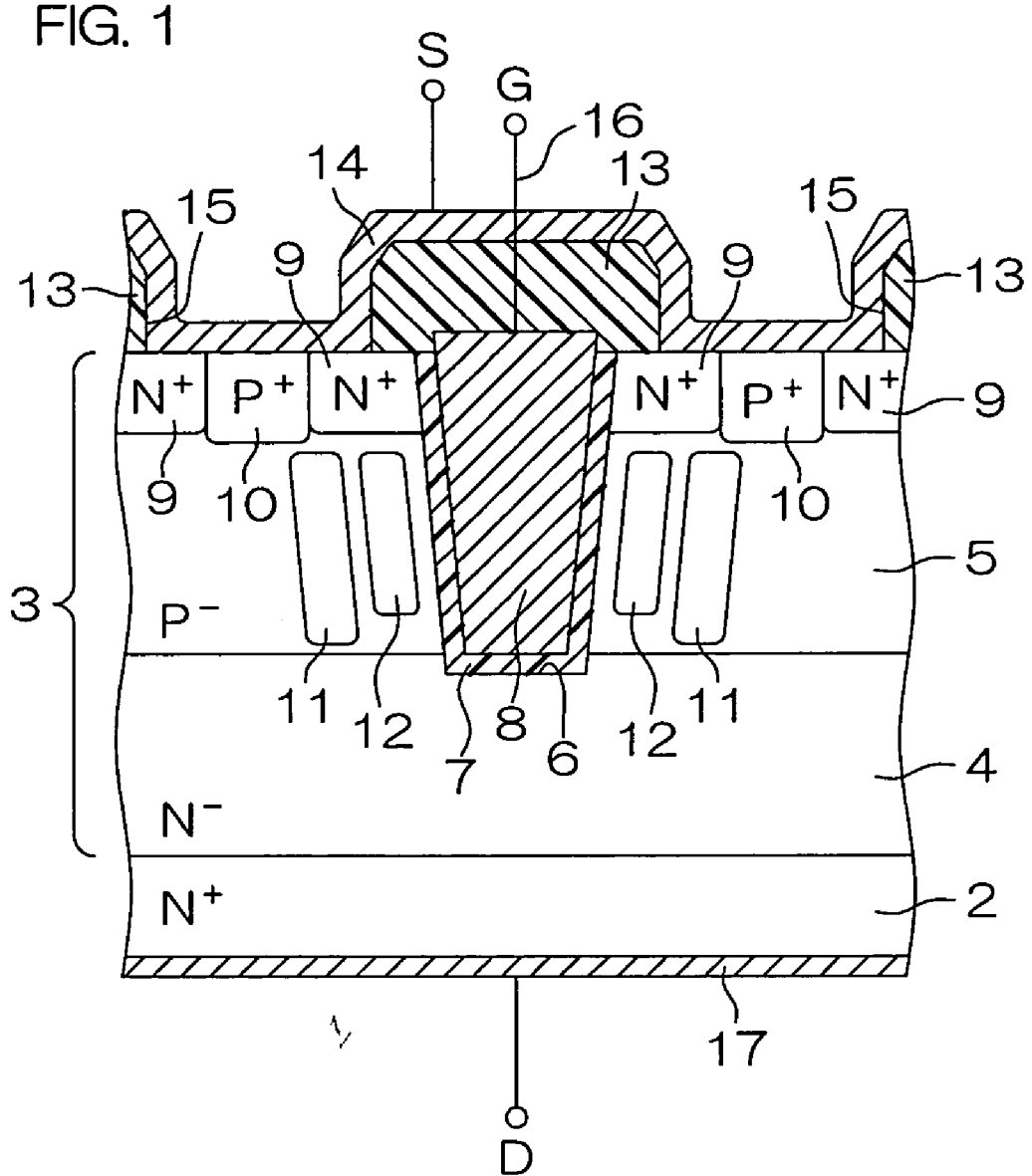
FIG. 1 is a schematic sectional view of a semiconductor device according to a first embodiment of the present invention.

FIG. 1 is a schematic sectional view of a semiconductor device 1 according to a first embodiment of the present invention.

The semiconductor device 1 has an array structure formed by arranging unit cells having trench gate VDMOSFETS in the form of a matrix.

An $N^-$-type epitaxial layer 3 as a semiconductor layer made of silicon doped with an N-type impurity in a lower concentration ($10^{15}/cm^3$, for example) than that of an $N^+$-type substrate 2 is laminated on the $N^+$-type substrate 2 forming the base of the semiconductor device 1. A base layer portion of the epitaxial layer 3 maintains the epitaxially grown state, and forms an $N^-$-type region 4 as a first conductivity type region. In the epitaxial layer 3, a $P^-$-type body region 5 is formed on the $N^-$-type region 4 to be in contact with the $N^-$-type region 4.

A trench 6 is formed in the epitaxial layer 3 by digging the surface thereof. The trench 6 passes through the body region 5, so that the deepest region thereof reaches the $N^-$-type region 4. A plurality of such trenches 6 are formed at constant intervals in the horizontal direction in FIG. 1, and extend in a direction (along the gate width) orthogonal to the plane of FIG. 1 respectively. A gate insulating film 7 is formed in each trench 6, to cover the overall inner surface thereof. A gate electrode 8 is buried in the trench 6 by filling up the inner side of the gate insulating film 7 with polysilicon doped with an N-type impurity in a high concentration.

In a surface layer portion of the epitaxial layer 3, $N^+$-type source regions 9 each having a higher N-type impurity concentration ($10^{19}/cm^3$, for example) than that of the $N^-$-type region 4 are formed on both sides of the trench 6 in the direction (horizontal direction in FIG. 1) orthogonal to the gate width. Each source region 9 extends along the trench 6 in the direction along the gate width, so that the bottom portion thereof is in contact with the body region 5. A $P^+$-type source contact region 10 is formed at the center of the source region 9 in the direction orthogonal to the gate width, to pass through the source region 9.

Such trenches 6 and source regions 9 are alternately provided in the direction orthogonal to the gate width, and extend in the direction along the gate width respectively. On each source region 9, the boundary between unit cells adjacent to each other in the direction orthogonal to the gate width is set along the source region 9. At least one or more source contact regions 10 are provided over each pair of unit cells adjacent to each other in the direction orthogonal to the gate width. The boundary between the unit cells adjacent to each other in the direction orthogonal to the gate width is so set that the gate electrode 8 included in each unit cell has a constant gate width.

In the body region 5 of each unit cell, a high-concentration region 11 having a higher P-type impurity concentration than that of the periphery thereof is formed on a position opposed to the trench 6 at an interval in the direction orthogonal to the gate width. The upper end portion of the high-concentration region 11 is arranged in the vicinity of the boundary between the source region 9 and the source contact region 10, while the lower end portion thereof is arranged in the vicinity of the $N^-$-type region 4.

In the body region 5 of each unit cell, further, a channel implant region 12 properly doped with an N-type impurity is formed between the trench 6 and the high-concentration region 11.

An interlayer dielectric film 13 is laminated on the epitaxial layer 3. A source wire 14 is formed on the interlayer dielectric film 13. This source wire 14 is grounded. The source wire 14 is in contact (electrically connected) with the source region 9 and the source contact region 10 through a contact hole 15 formed in the interlayer dielectric film 13. A gate wire 16 is electrically connected to the gate electrode 8 through a contact hole (not shown) formed in the interlayer dielectric film 13.

A drain electrode 17 is formed on the back surface of the $N^+$-type substrate 2.

A current can be flowed between the source region 9 and the drain electrode 17 by controlling the potential of the gate electrode 8 while applying a positive voltage of a proper level to the drain electrode 17 thereby forming a channel in the vicinity of the interface between the body region 5 and the gate insulating film 7.

In the body region 5, the high-concentration region 11 having a higher P-type impurity concentration than that of the periphery thereof is formed on the position opposed to the trench 6 in the direction orthogonal to the gate width. Due to the formation of this high-concentration region 11, a depletion layer can be inhibited from extending toward the source region 9. Consequently, the depth of the trench 6 can be reduced. The depth of the trench 6 is so reduced that portions around the upper and lower ends of the trench 6 can be prevented from application of remarkable stress, whereby formation of crystal defects resulting from stress can be prevented.

In this semiconductor device 1, the channel implant region 12 properly doped with the N-type impurity is formed between the trench 6 and the high-concentration region 11.

The threshold voltage can be controlled by adjusting the quantity of the N-type impurity contained in the channel implant region 12.

FIGS. 2A to 2L are schematic sectional views successively showing the steps of manufacturing the semiconductor device 1.

Figure 2A:
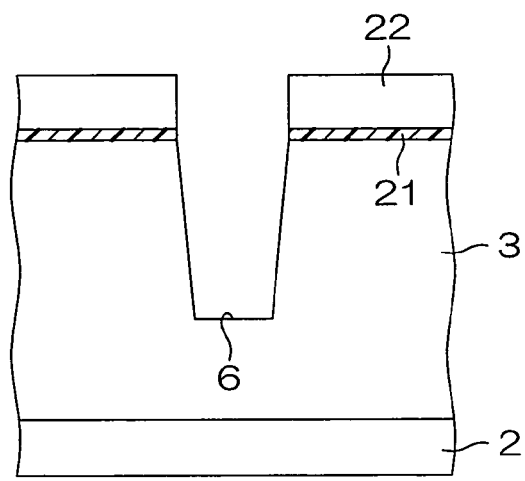
FIGS. 2A to 2L are schematic sectional views successively showing the steps of manufacturing the semiconductor device shown in FIG. 1.

First, the epitaxial layer 3 is formed on the N$^+$-type substrate 2 by epitaxy, as shown in FIG. 2A. Then, a sacrificial oxide film 21 made of SiO$_2$ (silicon oxide) is formed on the surface of the epitaxial layer 3 by thermal oxidation. Thereafter an SiN (silicon nitride) layer is formed on the sacrificial oxide film 21 by P-CVD (Plasma Chemical Vapor Deposition) or LP-CVD (Low Pressure Chemical Vapor Deposition) and so patterned as to form a hard mask 22 having an opening in a portion opposed to the portion for forming the trench 6. Then, the trench 6 is formed by etching the sacrificial oxide film 21 and the epitaxial layer 3 through the hard mask 22 (trench forming step).

Figure 2B:
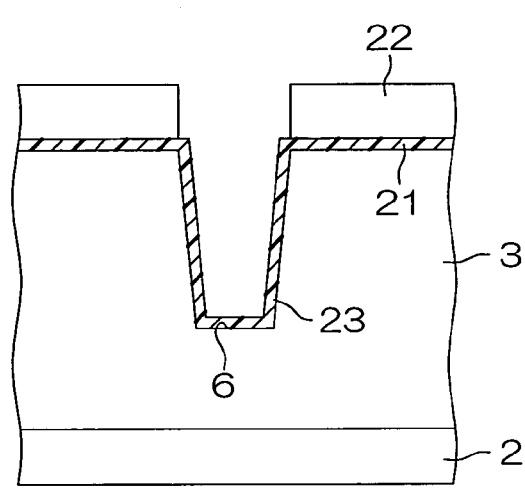

Then, thermal oxidation is performed while leaving the hard mask 22 on the sacrificial oxide film 21 thereby forming a sacrificial oxide film 23 made of SiO$_2$ on the inner surface of the trench 6, as shown in FIG. 2B.

Figure 2C:
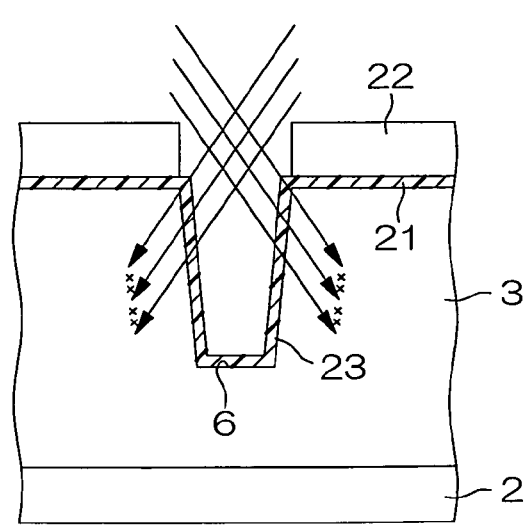

Thereafter ions of a P-type impurity (boron, for example) are obliquely implanted into the trench 6 from both sides orthogonal to the gate width, as shown in FIG. 2C (first implantation step). In other words, the ions of the P-type impurity are obliquely implanted into the epitaxial layer 3 through both side surfaces of the sacrificial oxide film 23 opposed to each other in the direction orthogonal to the gate width. When the width of the trench 6 in the direction orthogonal to the gate width is 0.5 μm, the depth of the trench 6 is 1.0 μm and the thickness of the hard mask 22 is 0.5 μm, for example, the ions of the P-type impurity can be excellently implanted into an inner portion (portion for forming the high-concentration region 11) of the epitaxial layer 3 only through both side surfaces of the sacrificial oxide film 23 opposed to each other in the direction orthogonal to the gate width by performing oblique implantation at an inclination angle (implantation angle) of not less than 18° with respect to the direction orthogonal to the surface of the hard mask 22. The upper end portion of the high-concentration region 11 is arranged in the vicinity of the boundary between the source region 9 and the source contact region 10, while the lower end portion thereof is arranged in the vicinity of the N$^-$-type region 4. The dose at this point is $10^{11}$ to $10^{13}$/cm$^2$, for example.

Figure 2D:
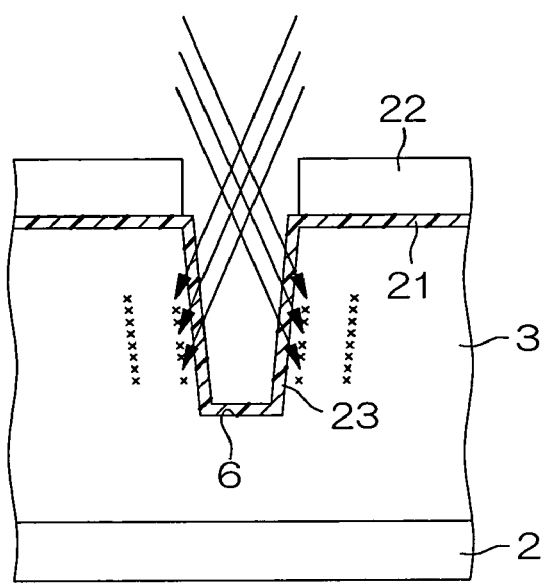

Then, ions of an N-type impurity are obliquely implanted into another inner portion (portion for forming the channel implant region 12) of the epitaxial layer 3 through both side surfaces of the sacrificial oxide film 23 opposed to each other in the direction orthogonal to the gate width, as shown in FIG. 2D. The dose at this point is 1o11 to $10^{13}$/cm$^2$, for example.

Figure 2E:
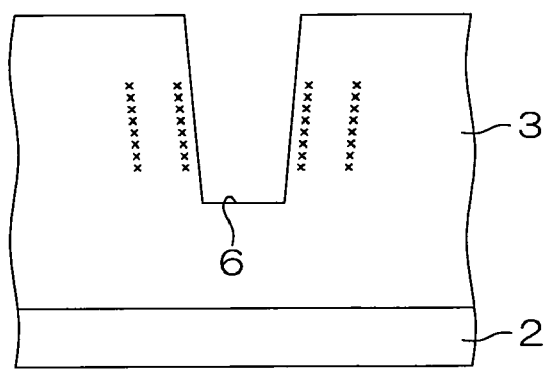

After the oblique implantation of the ions of the N-type impurity, the hard mask 22 is removed, as shown in FIG. 2E. Further, the sacrificial oxide films 21 and 23 are removed. Thus, the surface of the epitaxial layer 3 is exposed.

Figure 2F:
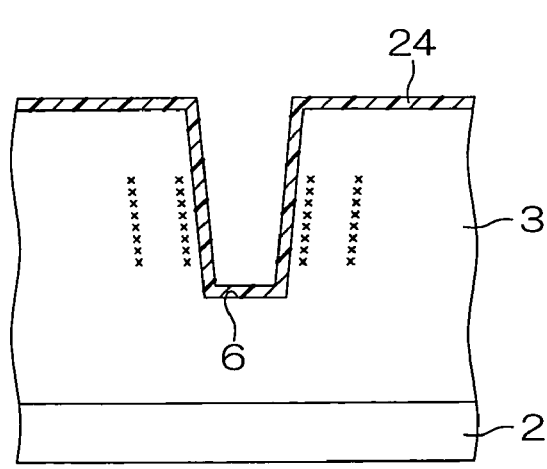

Thereafter an oxide film 24 made of SiO$_2$ is formed on the overall surface of the epitaxial layer 3 including the inner surface of the trench 6 by thermal oxidation, as shown in FIG. 2F.

Figure 2G:
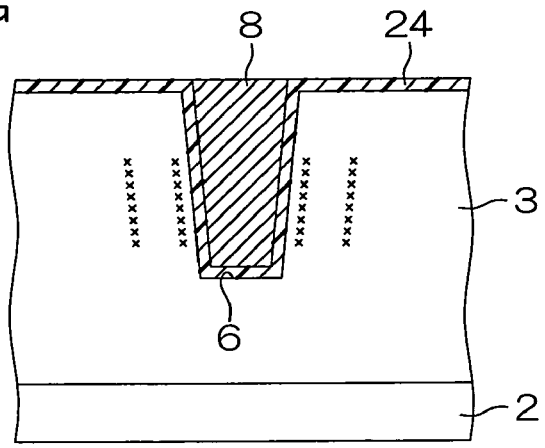

Then, a deposition layer of polysilicon doped with an N-type impurity in a high concentration is formed on the oxide film 24 by CVD. The trench 6 is filled up with the deposition layer of polysilicon. Then, portions of the deposition layer of polysilicon present outside the trench 6 are removed by etching. Thus, the gate electrode 8 buried in the trench 6 is obtained as shown in FIG. 2G (step of burying a gate electrode).

Figure 2H:
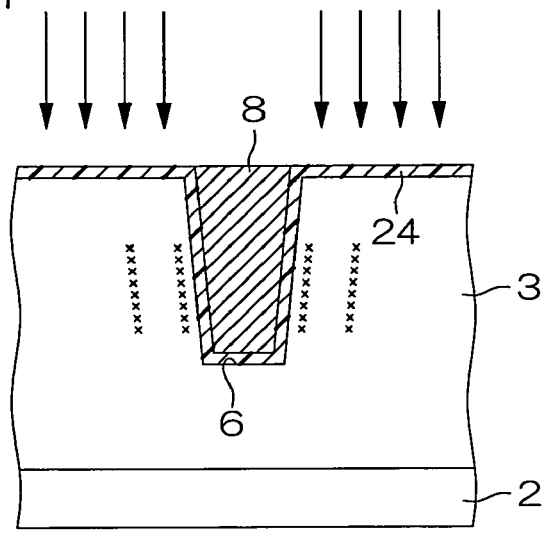

Thereafter ions of a P-type impurity are implanted into the epitaxial layer 3 from the surface of the oxide film 24, as shown in FIG. 2H (second implantation step).

Figure 2I:
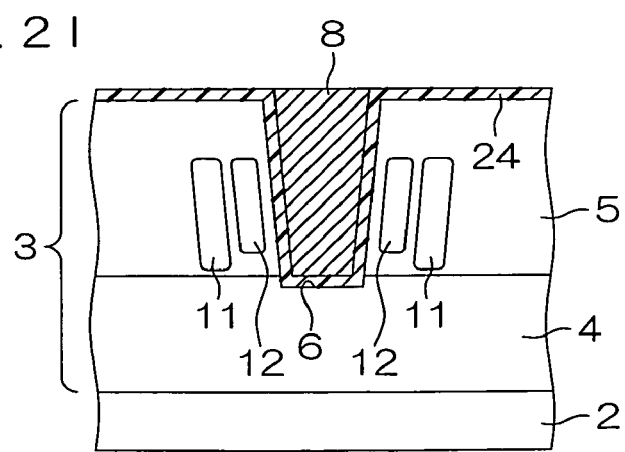

Then, drive-in diffusion is performed. The ions of the N-type and P-type impurities implanted into the epitaxial layer 3 in the aforementioned steps are diffused due to this drive-in diffusion, whereby the body region 5, the high-concentration region 11 and the channel implant region 12 are formed in the epitaxial layer 3, as shown in FIG. 2I (step of forming a body region and a high-concentration region).

Figure 2J:
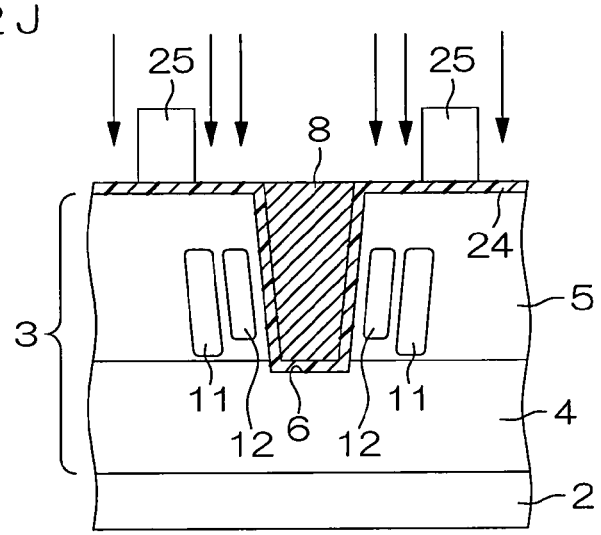

After the drive-in diffusion, a mask 25 having an opening in a portion opposed to the portion for forming the source region 9 is formed on the oxide film 24, as shown in FIG. 2J. Then, ions of an N-type impurity are implanted into the surface layer portion of the epitaxial layer 3 through the opening of the mask 25 (third implantation step). After this ion implantation, the mask 25 is removed.

Figure 2K:
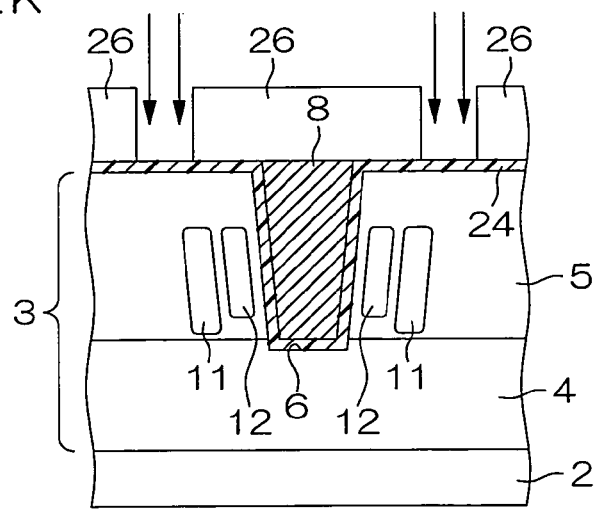

Then, a mask 26 having an opening in a portion opposed to the portion for forming the source contact region 10 is formed on the oxide film 24, as shown in FIG. 2K. Then, ions of a P-type impurity are implanted into the surface layer portion of the epitaxial layer 3 through the opening of the mask 26 (fourth implantation step). After this ion implantation, the mask 26 is removed.

Figure 2L:
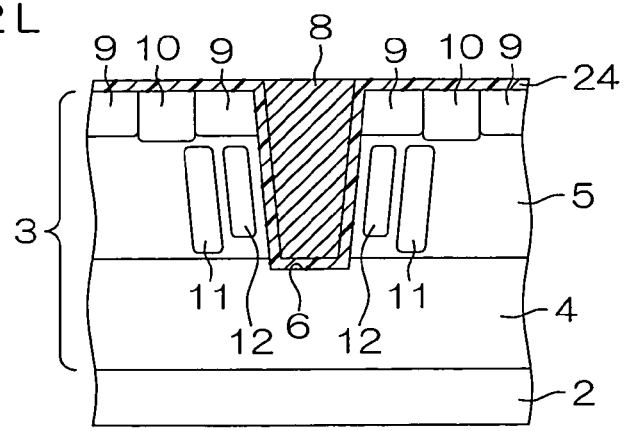

Thereafter annealing is performed. The ions of the N-type and P-type impurities implanted into the surface layer portion of the epitaxial layer 3 are activated due to this annealing, whereby the source region 9 and the source contact region 10 are formed in the surface layer portion of the epitaxial layer 3, as shown in FIG. 2L.

After the aforementioned steps, portions of the oxide film 24 present outside the trench 6 are removed so that the oxide film 24 is left only on the inner surface of the trench 6, whereby the gate insulating film 7 is obtained (step of forming a gate insulating film). Thereafter the interlayer dielectric film 13 is formed on the epitaxial layer 3 by CVD. After the contact hole 15 is formed in the interlayer dielectric film 13 by etching, the source wire 14, the gate wire 16 and the drain electrode 17 are so formed as to obtain the semiconductor device 1 shown in FIG. 1.

Figure 3:
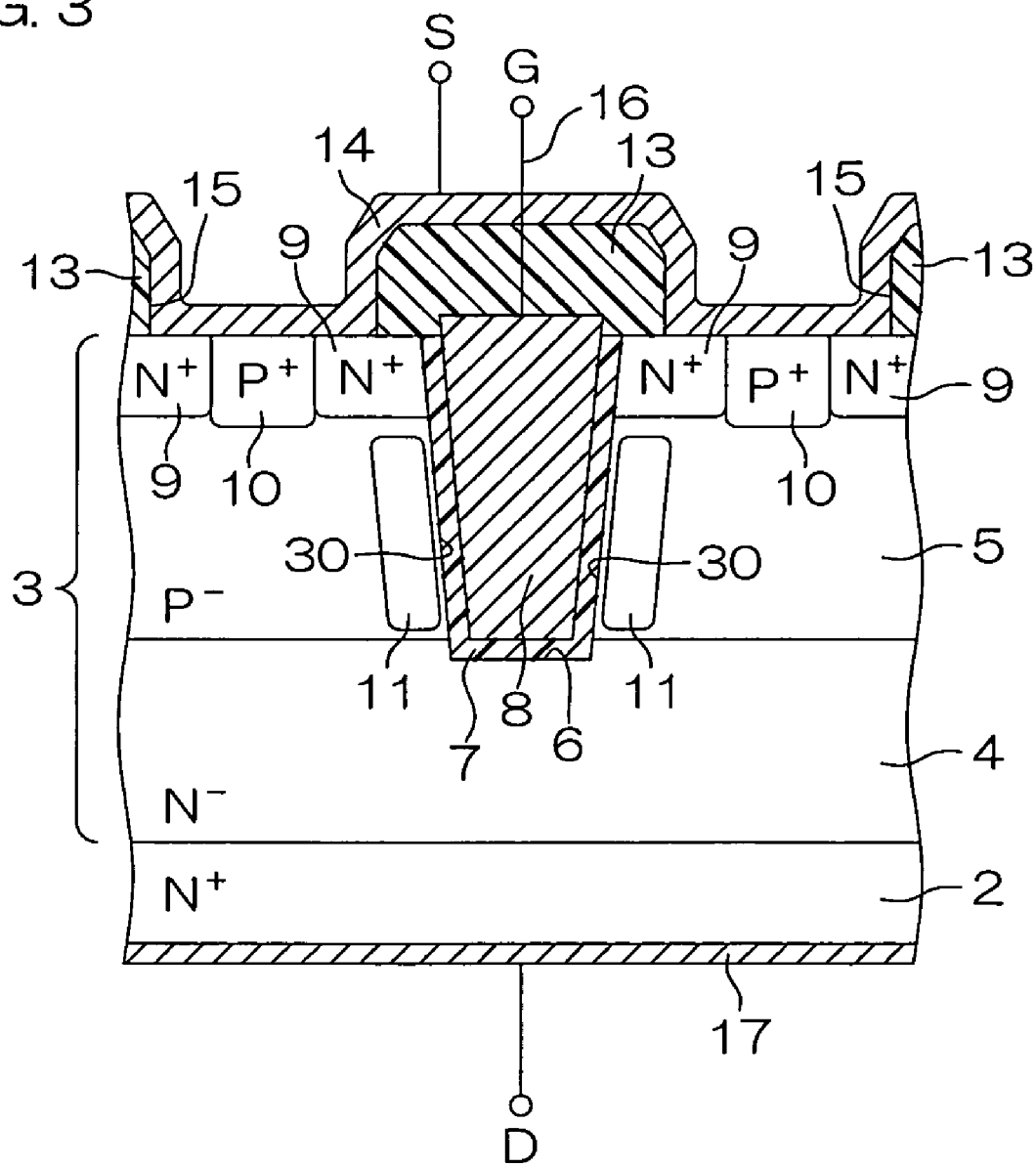
FIG. 3 is a schematic sectional view of a semiconductor device according to a second embodiment of the present invention.

FIG. 3 is a schematic sectional view of a semiconductor device 31 according to a second embodiment of the present invention. Referring to FIG. 3, portions corresponding to those shown in FIG. 1 are denoted by the same reference numerals. In the following, redundant description is omitted as to the portions denoted by the same reference numerals.

In the semiconductor device 31 shown in FIG. 3, high-concentration regions 11 are formed adjacently to a pair of side surfaces 30 of a trench 6 opposed to each other in the direction orthogonal to the gate width. More specifically, each high-concentration region 11 is formed under a source region 9, to be closer to the trench 6 than the center of the source region 9 in the direction orthogonal to the gate width.

The remaining structure and the operation of the semiconductor device 31 are similar to those of the aforementioned semiconductor device 1 according to the first embodiment. In other words, a current can be flowed between the source region 9 and a drain electrode 17 by controlling the potential of a gate electrode 8 while applying a positive voltage (drain voltage) of a proper level to the drain electrode 17 thereby forming a channel in the vicinity of the interface between a body region 5 and a gate insulating film 7, i.e., a portion of the body region 5 adjacent to the side surface 30 of the trench 6.

In this semiconductor device 31, the high-concentration region 11 having a higher P-type impurity concentration than the periphery thereof is formed on the portion adjacent to the side surface 30 of the trench 6, whereby a depletion layer can be inhibited from spreading along the sidewall of the trench 6. Therefore, occurrence of a punch-through between an N⁻-type region 4 and the source region 9 can be suppressed.

FIGS. 4A to 4K are schematic sectional views successively showing the steps of manufacturing the semiconductor device 31.

Figure 4A:
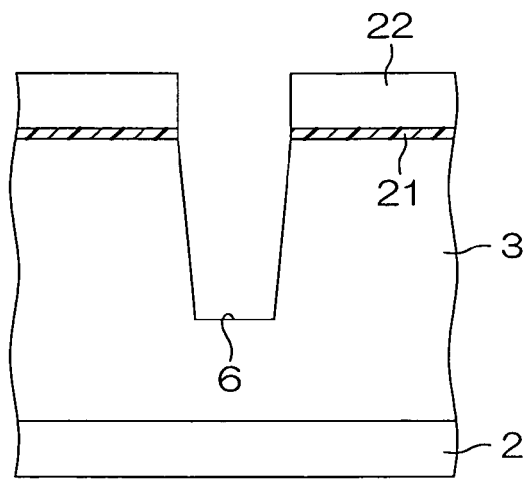
FIGS. 4A to 4K are schematic sectional views successively showing the steps of manufacturing the semiconductor device shown in FIG. 3.

First, an epitaxial layer 3 is formed on an N⁺-type substrate 2 and so etched as to form the trench 6 through a step similar to that shown in FIG. 2A, as shown in FIG. 4A (trench forming step).

Figure 4B:
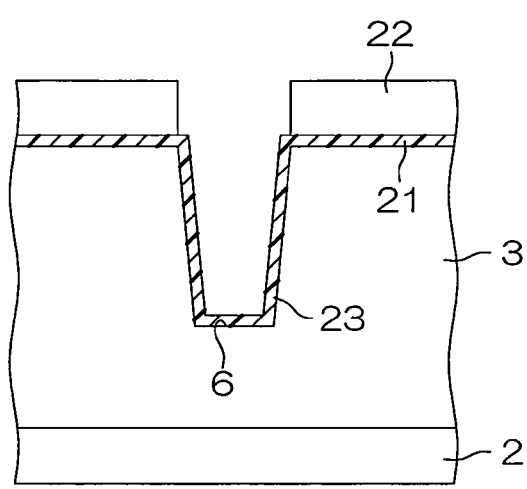

Then, a sacrificial oxide film 23 made of $SiO_2$ is formed on the inner surface of the trench 6 through a step similar to that shown in FIG. 2B, as shown in FIG. 4B.

Figure 4C:
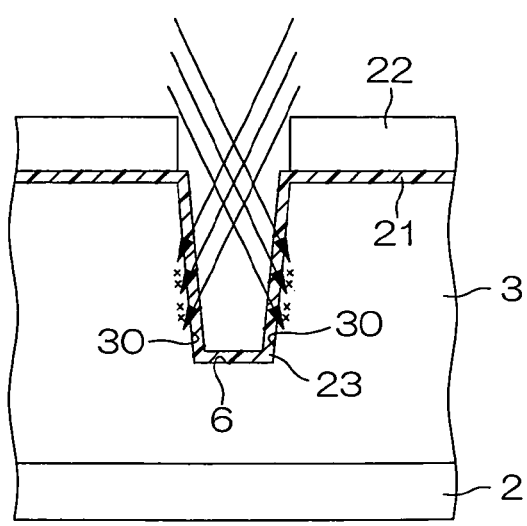

Thereafter ions of a P-type impurity (boron, for example) are obliquely implanted into the trench 6 from both sides orthogonal to the gate width, as shown in FIG. 4C (first implantation step). When the width of the trench 6 in the direction orthogonal to the gate width is 0.5 μm, the depth of the trench 6 is 1.0 μm and the thickness of a hard mask 22 is 0.5 μm, for example, the ions of the P-type impurity are obliquely implanted at an inclination angle (implantation angle) of not less than 18° with respect to the direction orthogonal to the surface of the hard mask 22. Thus, the P-type impurity can be implanted into the side surface 30 of the trench 6 and the portion adjacent to the side surface 30. The dose at this point is $10^{11}$ to $10^{13}/cm^2$, for example.

Figure 4D:
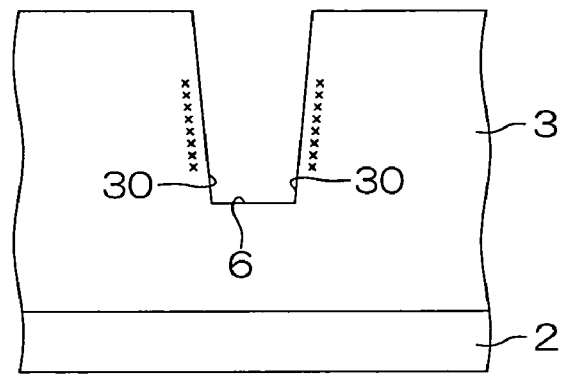

Then, the hard mask 22 and sacrificial oxide films 21 and 23 are removed, as shown in FIG. 4D. Thus, the surface of the epitaxial layer 3 is exposed.

Figure 4E:
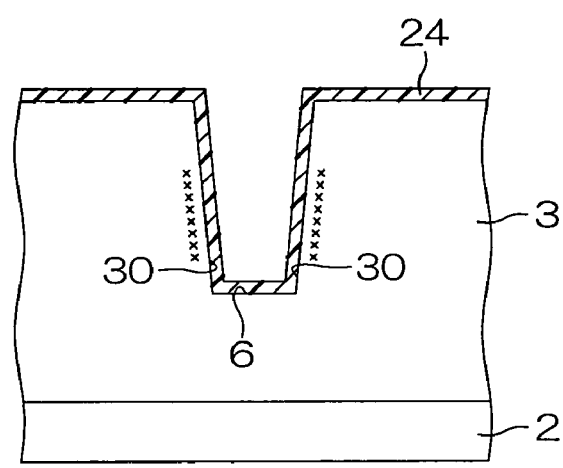

Thereafter an oxide film 24 made of $SiO_2$ is formed on the overall surface of the epitaxial layer 3 including the inner surface of the trench 6 by thermal oxidation, as shown in FIG. 4E.

Figure 4F:
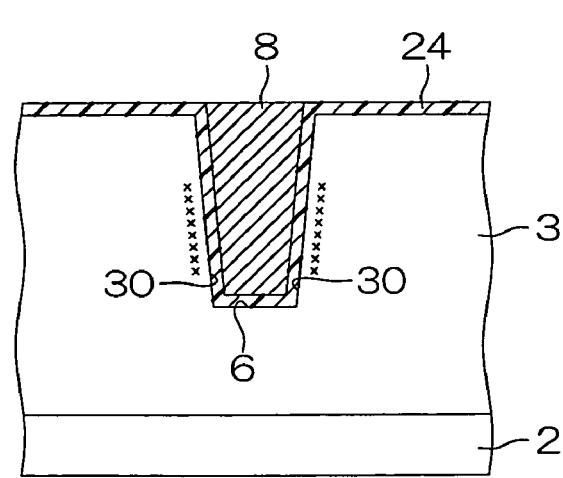

Then, a deposition layer of polysilicon doped with an N-type impurity in a high concentration is formed on the oxide film 24 by CVD. The trench 6 is filled up with the deposition layer of polysilicon. Then, portions of the deposition layer of polysilicon present outside the trench 6 are removed by etching. Thus, the gate electrode 8 buried in the trench 6 is obtained as shown in FIG. 4F (step of burying a gate electrode).

Figure 4G:
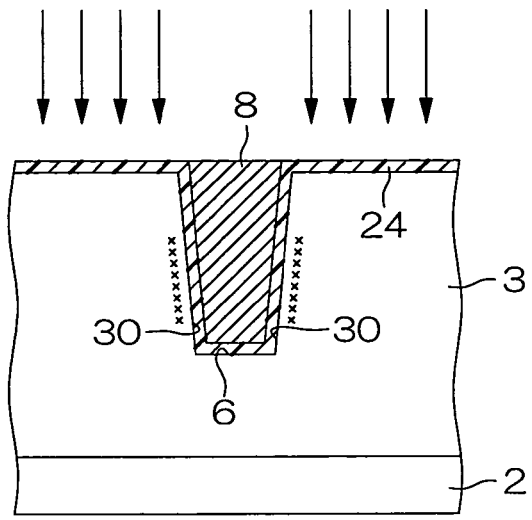

Thereafter ions of a P-type impurity are implanted into the epitaxial layer 3 from the surface of the oxide film 24, as shown in FIG. 4G (second implantation step). At this time, the P-type impurity is implanted into the side surface 30 of the trench 6 and the region adjacent to the side surface 30 in a dose of $10^{12}$ to $10^{13}/cm^2$, for example.

Figure 4H:
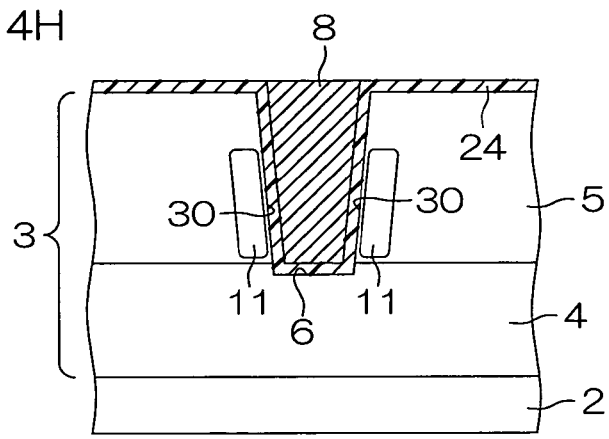

Then, drive-in diffusion is performed. The ions of the P-type impurity implanted into the epitaxial layer 3 in the aforementioned step are diffused due to this drive-in diffusion. Thus, the body region 5 and the high-concentration region 11 are formed in the epitaxial layer 3, as shown in FIG. 4H (step of forming a body region and a high-concentration region).

Figure 4I:
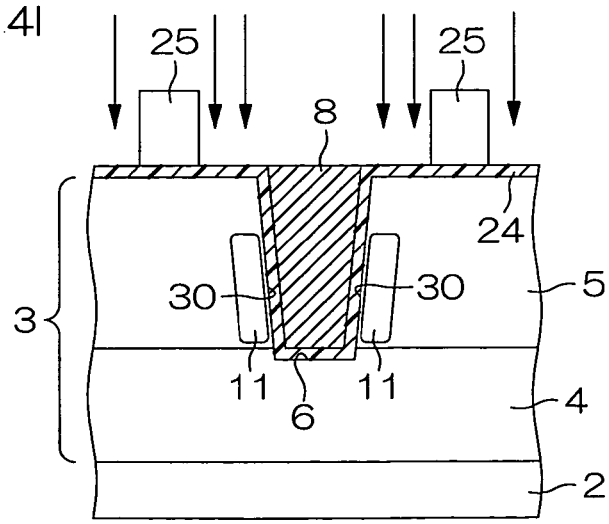

After the drive-in diffusion, a mask 25 having an opening in a portion opposed to the portion for forming the source region 9 is formed on the oxide film 24, as shown in FIG. 4I. Then, ions of an N-type impurity are implanted into a surface layer portion of the epitaxial layer 3 through the opening of the mask 25 (third implantation step). After this ion implantation, the mask 25 is removed.

Figure 4J:
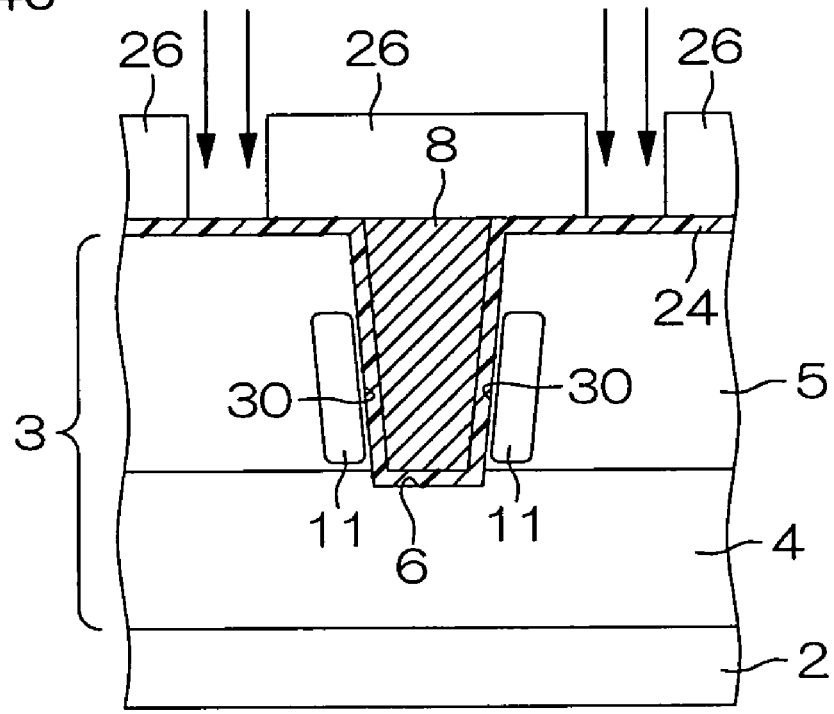

Then, a mask 26 having an opening in a portion opposed to a portion for forming a source contact region 10 is formed on the oxide film 24, as shown in FIG. 4J. Then, ions of a P-type impurity are implanted into the surface layer portion of the epitaxial layer 3 through the opening of the mask 26 (fourth implantation step). After this ion implantation, the mask 26 is removed.

Figure 4K:
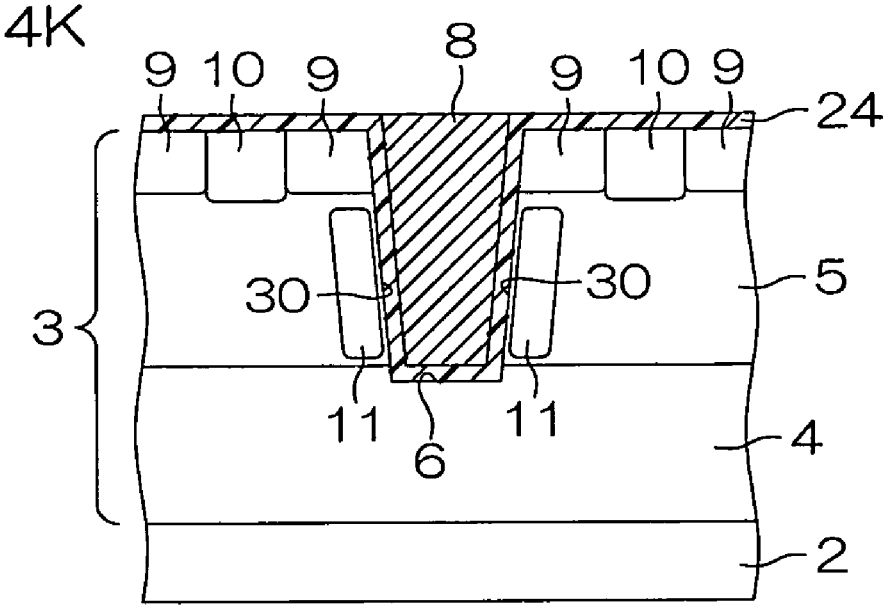

Thereafter annealing is performed. The source region 9 and the source contact region 10 are formed in the surface layer portion of the epitaxial layer 3 due to this annealing, as shown in FIG. 4K.

After the aforementioned steps, portions of the oxide film 24 present outside the trench 6 are removed so that the oxide film 24 is left only on the inner surface of the trench 6, whereby the gate insulating film 7 is obtained (step of forming a gate insulating film). Thereafter an interlayer dielectric film 13 is formed on the epitaxial layer 3 by CVD. After a contact hole 15 is formed in the interlayer dielectric film 13 by etching, a source wire 14, a gate wire 16 and the drain electrode 17 are so formed as to obtain the semiconductor device 31 shown in FIG. 3.

In the aforementioned method, the P-type impurity is implanted into the side surface 30 of the trench 6 and the region adjacent to the side surface 30 in the step shown in FIG. 4C.

Even if the P-type impurity contained in the side surface 30 of the trench 6 or the portion adjacent to the side surface 30 is drawn into the oxide film 24 in the drive-in diffusion shown in FIG. 4H or a heat treatment step (such as the annealing step shown in FIG. 4K, for example) after this step, therefore, the P-type impurity concentration around the side surface 30 can be kept generally identical to the P-type impurity concentration of at least the periphery (excluding the high-concentration region 11) thereof. Further, the high-concentration region 11 can be formed on the portion adjacent to the side surface 30. Consequently, a semiconductor device capable of suppressing occurrence of a punch-through between the N⁻-type region 4 and the source region 9 can be provided.

Figure 5:
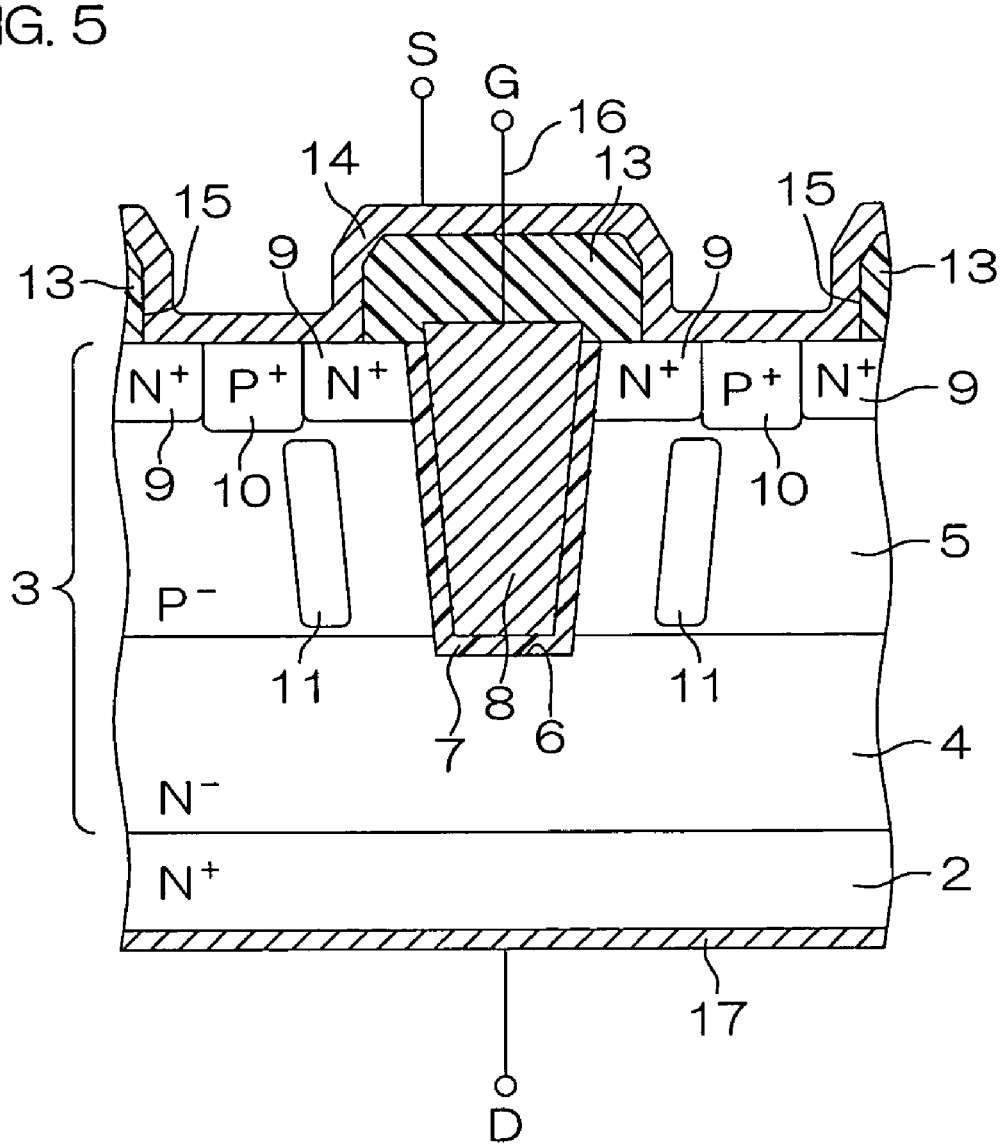
FIG. 5 is a schematic sectional view of a semiconductor device according to a third embodiment of the present invention.

FIG. 5 is a schematic sectional view of a semiconductor device 41 according to a third embodiment of the present invention. Referring to FIG. 5, portions corresponding to those shown in FIG. 1 are denoted by the same reference numerals. In the following, redundant description is omitted as to the portions denoted by the same reference numerals.

In the semiconductor device 41 shown in FIG. 5, no channel implant region 12 is formed between a trench 6 and a high-concentration region 11, while the upper end portion of the high-concentration region 11 is arranged in the vicinity of the boundary between a source region 9 and a source contact region 10 and the lower end portion thereof is arranged in the vicinity of an N⁻-type region 4, similarly to the first embodiment. Thus, half of the high-concentration region 11 farther from the trench 6 in the direction orthogonal to the gate width is arranged under the source contact region 10.

The remaining structure and the operation of the semiconductor device 41 are similar to those of the aforementioned semiconductor device 1 according to the first embodiment. In other words, a current can be flowed between the source region 9 and a drain electrode 17 by controlling the potential of a gate electrode 8 while applying a positive voltage (drain voltage) of a proper level to the drain electrode 17 thereby forming a channel in the vicinity of the interface between a body region 5 and a gate insulating film 7.

Thus, the high-concentration region 11 is partially arranged under the source contact region 10 in the semiconductor device 41.

Therefore, when a high counter electromotive voltage is applied to a trench gate MOSFET formed by the N⁻-type region 4, the gate electrode 8 and the source region 9 of an N+-type due to a flyback voltage at a turn-off time in an inductive load, for example, an avalanche current flows from the N−-type region 4 to the source contact region 10 through the high-concentration region 11. Thus, a parasitic bipolar transistor formed by the N−-type region 4, the body region 5 and the source region 9 can be prevented from entering an on state, thereby preventing thermal breakdown (avalanche breakdown) resulting from the on state of the parasitic bipolar transistor. Consequently, the avalanche resistance can be improved.

FIGS. 6A to 6K are schematic sectional views successively showing the steps of manufacturing the semiconductor device 41.

Figure 6A:
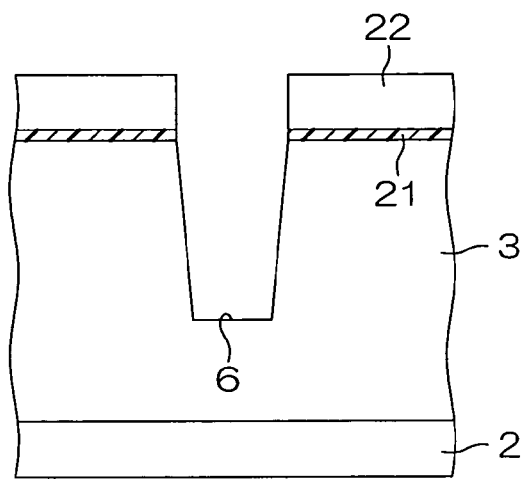
FIGS. 6A to 6K are schematic sectional views successively showing the steps of manufacturing the semiconductor device shown in FIG. 5.

First, an epitaxial layer 3 is formed on an N+-type substrate 2 and so etched as to form the trench 6 through a step similar to that shown in FIG. 2A, as shown in FIG. 6A (trench forming step).

Figure 6B:
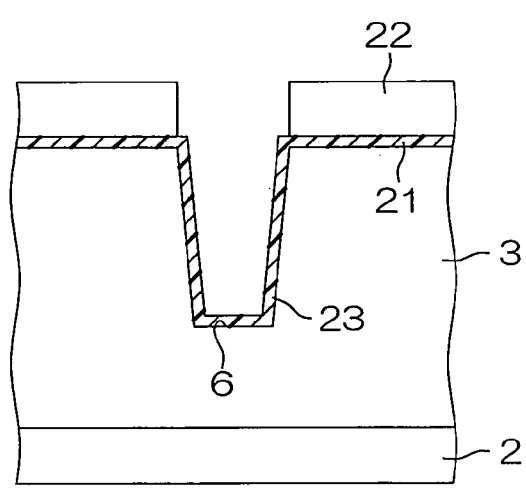

Then, a sacrificial oxide film 23 made of $SiO_2$ is formed on the inner surface of the trench 6 through a step similar to that shown in FIG. 2B, as shown in FIG. 6B.

Figure 6C:
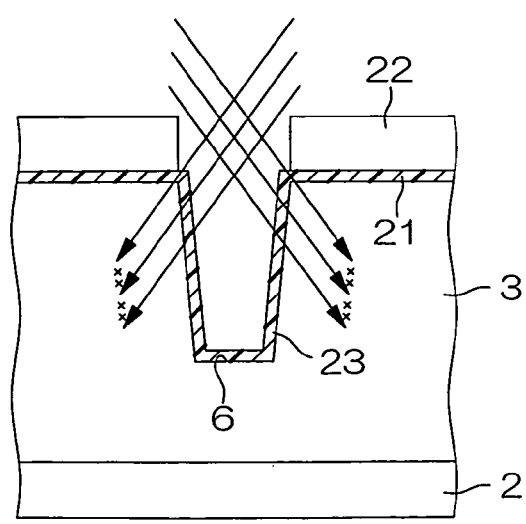
Figure 6D:
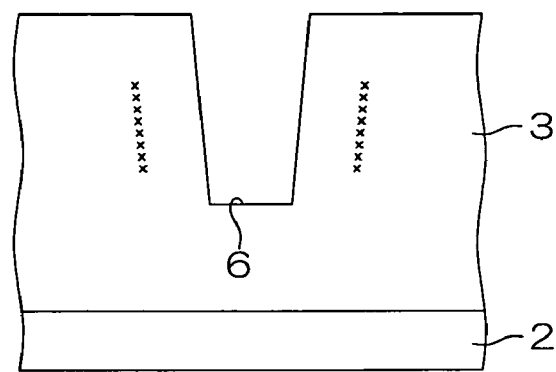
Figure 6E:
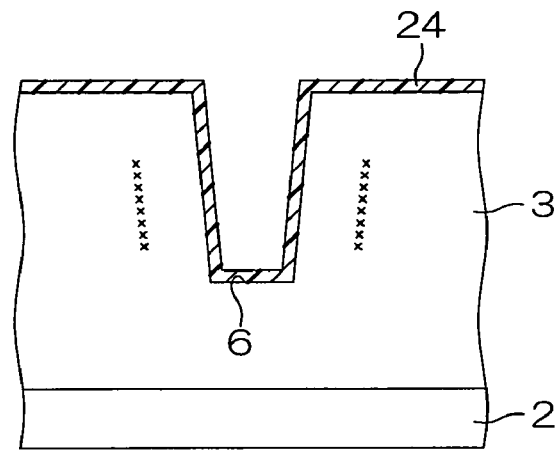
Figure 6F:
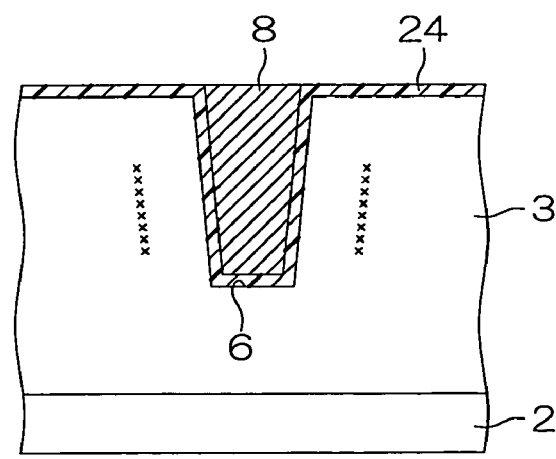
Figure 6G:
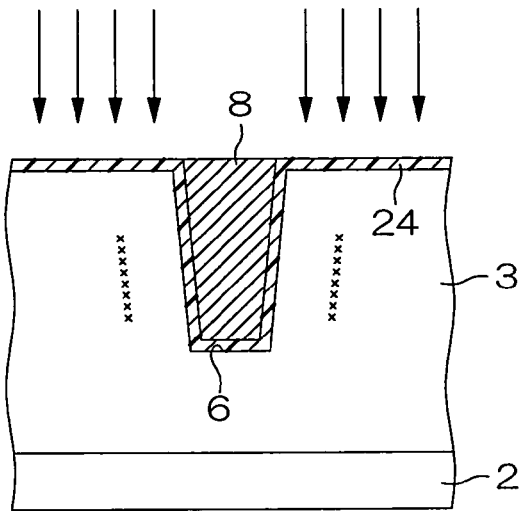
Figure 6H:
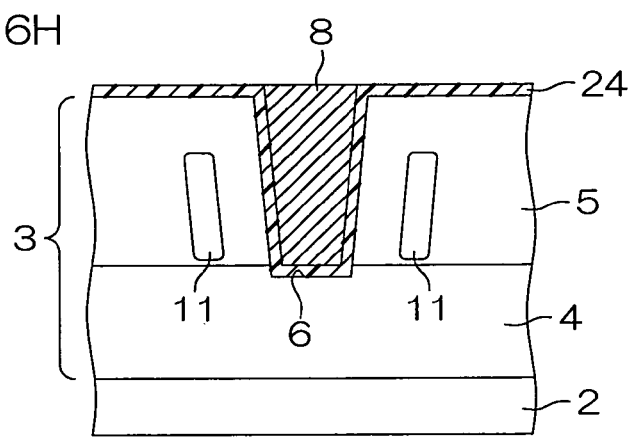
Figure 6I:
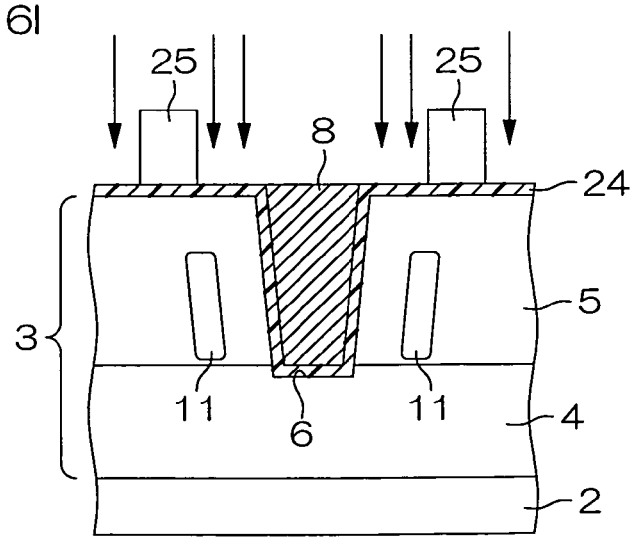
Figure 6J:
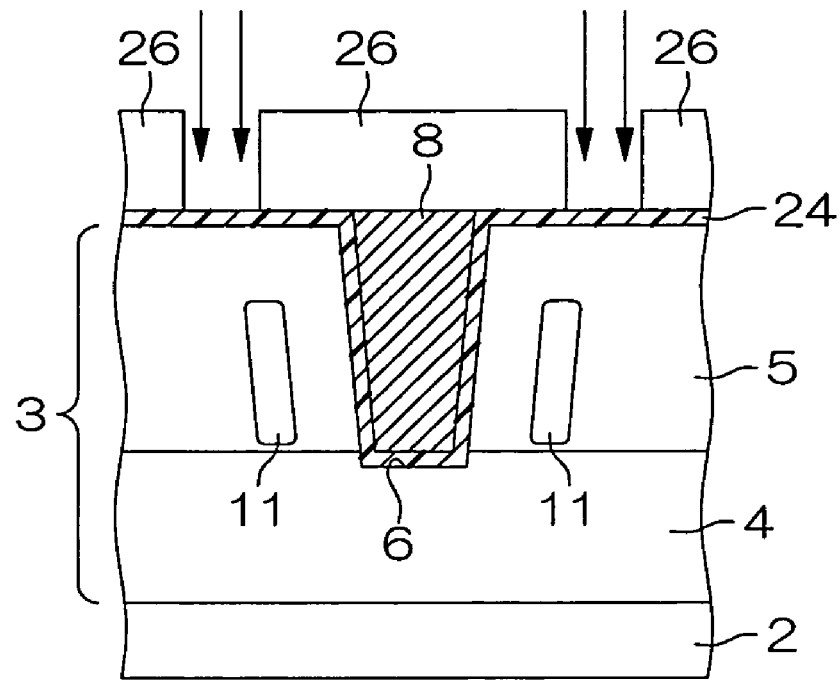
Figure 6K:
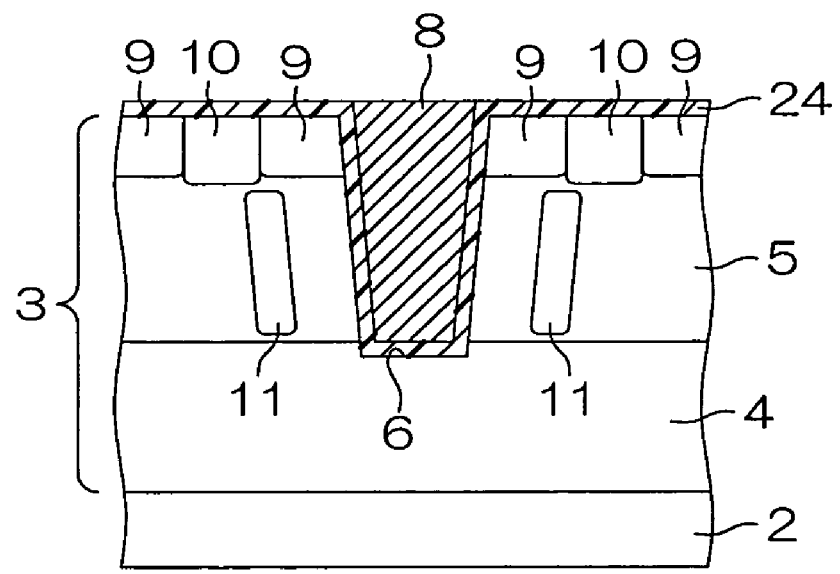

Then, ions of a P-type impurity (boron, for example) are obliquely implanted into the trench 6 from both sides orthogonal to the gate width through a step similar to that shown in FIG. 2C, as shown in FIG. 6C (first implantation step).

Thereafter steps similar to those shown in FIGS. 2E to 2L are carried out as shown in FIGS. 6D to 6K without the step of implanting the N-type impurity ions into the epitaxial layer 3 shown in FIG. 2D, whereby the semiconductor device 41 shown in FIG. 5 is obtained. In order to form the high-concentration region 11 under the source contact region 10, the P-type impurity may be obliquely implanted at an inclination angle (implantation angle) of not less than 18° with respect to a direction orthogonal to the surface of a hard mask 22 in the step shown in FIG. 6C, when the width of the trench 6 in the direction orthogonal to the gate width is 0.5 μm, the depth of the trench 6 is 1.0 μm and the thickness of the hard mask 22 is 0.5 μm, for example.

While a plurality of embodiments of the present invention have been described, the present invention may be embodied in other ways.

For example, the conductivity types of the respective semiconductor portions of the semiconductor device 1 may be reversed. In other words, the P-type portions may be converted to N-type portions and vice versa in the semiconductor device 1.

Figure 7:
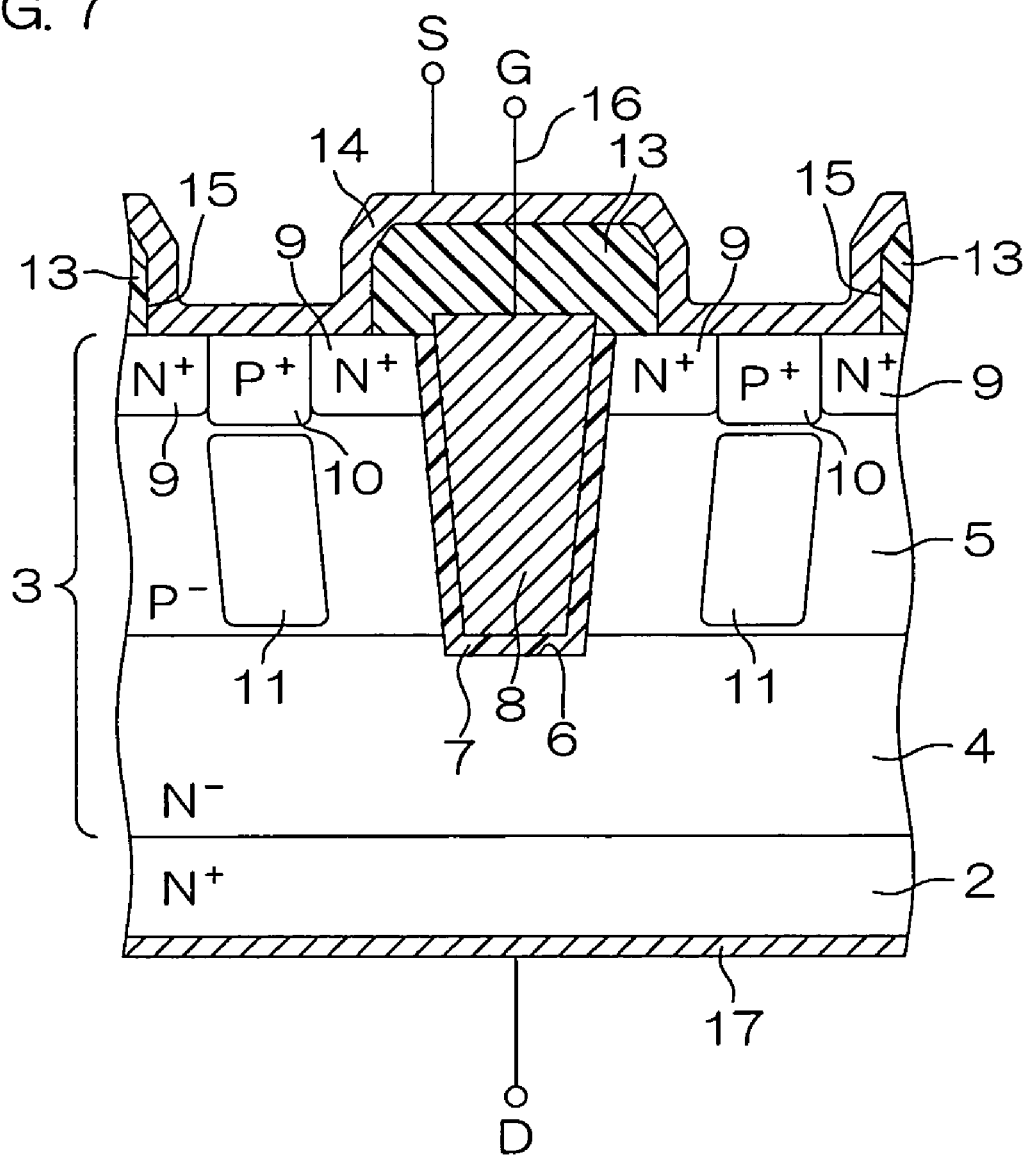
FIG. 7 is a sectional view showing a modification of the semiconductor device according to the third embodiment.

The high-concentration region 11 of the semiconductor device 41 according to the third embodiment may have a larger width in the direction orthogonal to the gate width as shown in FIG. 7, for example. More specifically, the width of the high-concentration region 11 may be generally identical to the width of the source contact region 10 in this direction. The high-concentration region 11 may be partially arranged under the source contact region 10, or may be entirely arranged under the source contact region 10 as shown in FIG. 7.

Figure 8:
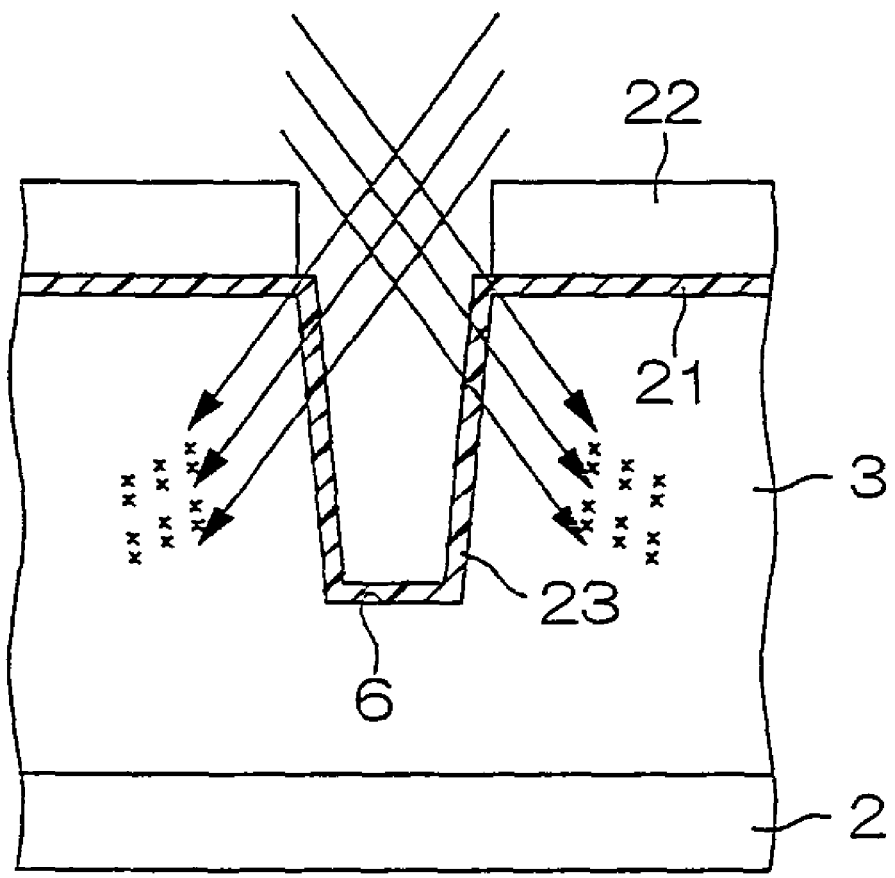
FIG. 8 is a schematic sectional view showing a step of manufacturing the semiconductor device shown in FIG. 7.
Figure 9:
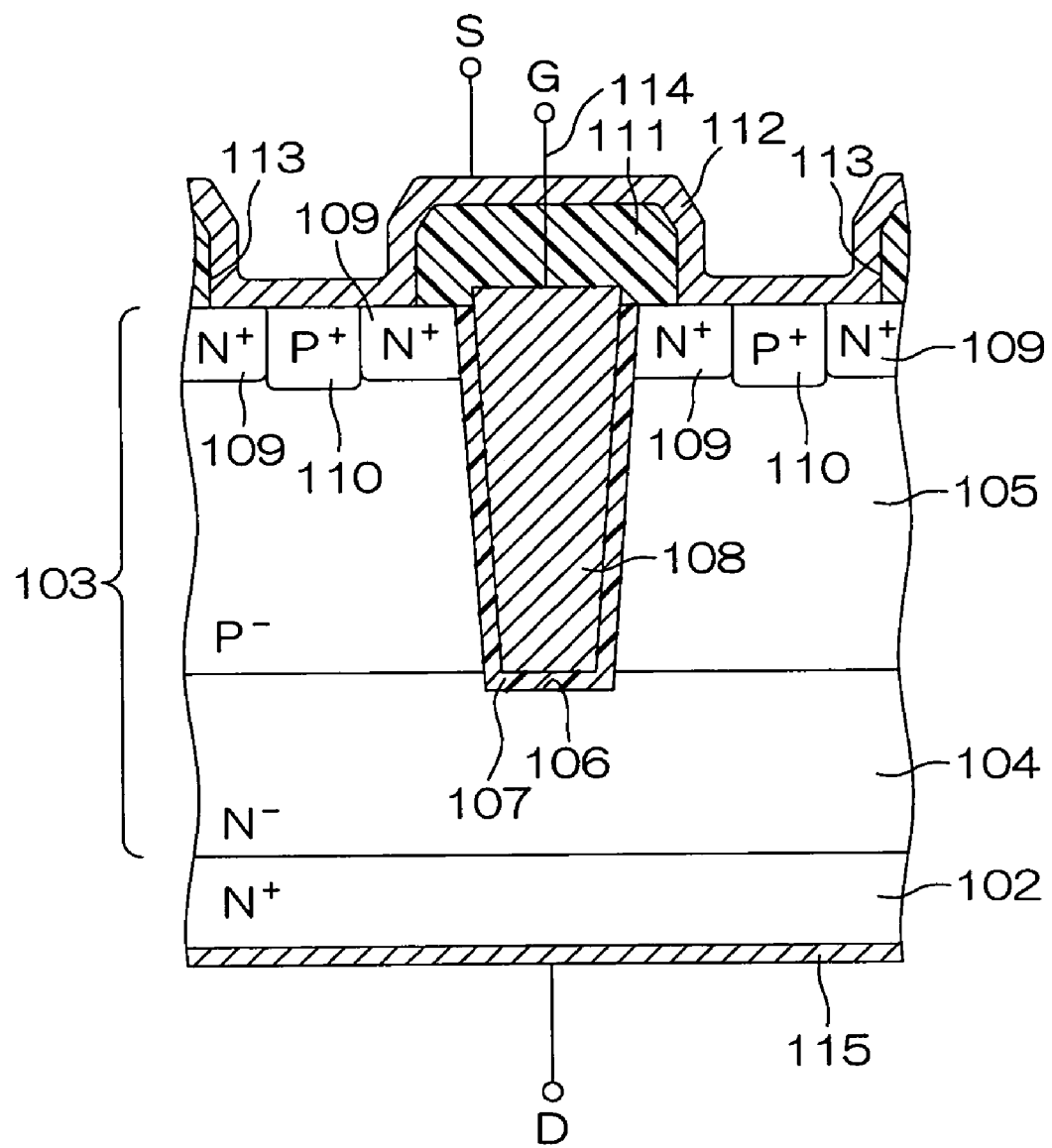
FIG. 9 is a schematic sectional view of a conventional semiconductor device including a trench gate VDMOSFET.

In order to form the aforementioned high-concentration region 11 having a larger width, the acceleration of the implanted P-type impurity ions is increased stepwise in the step shown in FIG. 6C, for example. Thus, the width of the ion-implanted region in the direction orthogonal to the gate width may be increased by implanting the ions into a plurality of positions having different distances from the trench 6 in this direction, as shown in FIG. 8.

While the present invention has been described in detail by way of the embodiments thereof, it should be understood that these embodiments are merely illustrative of the technical principles of the present invention but not limitative of the invention. The spirit ad scope of the present invention are to be limited only by the appended claims.

This application corresponds to Japanese Patent Application Nos. 2007-209808 and 2008-125139 filed in the Japanese Patent Office on Aug. 10, 2007 and May 12, 2008, the disclosures of which are incorporated herein by reference in its entirety.

What is claimed is:

1. A semiconductor device comprising:
   a semiconductor layer;
   a first conductivity type region of a first conductivity type disposed in a base layer portion of the semiconductor layer;
   a body region of a second conductivity type disposed in the semiconductor layer so as to be in contact with the first conductivity type region;
   a trench extending from a surface of the semiconductor layer to pass through the body region so that a deepest portion of the trench reaches the first conductivity type region;
   a gate insulating film disposed on a bottom surface and a side surface of the trench;
   a gate electrode having a gate width, and disposed in the trench on the gate insulating film;
   a source region of the first conductivity type disposed on a side of the trench in a surface layer portion of the semiconductor layer so as to be in contact with the body region;
   a high-concentration region of the second conductivity type disposed in the body region at a position opposed to the trench and having a higher second conductivity type impurity concentration than that of the body region; and
   a channel implant region, containing a first conductivity type impurity, disposed in the body region between the trench and the high-concentration region.

2. The semiconductor device according to claim 1, wherein the high-concentration region is disposed adjacent to the side surface of the trench.

3. The semiconductor device according to claim 1, wherein the high-concentration region is disposed under the source region, the high concentration region being closer than the center of the source region to the trench as measured in a direction orthogonal to the gate width.

4. The semiconductor device according to claim 1, wherein a contact region of the second conductivity type passing through the source region to come into contact with the body region is disposed in the surface layer portion of the semiconductor layer, and the high-concentration region is disposed under the contact region.

5. The semiconductor device according to claim 1, wherein the shallowest portion is at the surface of the semiconductor layer.

6. The semiconductor device according to claim 1, wherein the trench has opposing sides that continuously converge towards each other from the shallowest portion to the deepest portion.

7. The semiconductor device according to claim 1, wherein the deepest portion of the trench has a width that is narrower than a width of a shallowest portion of the trench.

8. The semiconductor device according to claim 2, wherein a contact region of the second conductivity type passing through the source region to come into contact with the body region is disposed in the surface layer portion of the semiconductor layer, and the high-concentration region is disposed under the contact region.

9. The semiconductor device according to claim 4, wherein a half of the high-concentration region that is farther from the trench than is the other half of the high-concentration region as measured in a direction orthogonal to the gate width, is arranged under the contact region.

10. The semiconductor device according to claim 4, wherein as measured in a direction orthogonal to the gate width, the high-concentration region has a width, which is the same as a width of the contact region, and is entirely arranged under the contact region.

11. The semiconductor device according to claim 8, wherein a half of the high-concentration region that is farther from the trench than is the other half of the high-concentration region as measured in a direction orthogonal to the gate width, is arranged under the contact region.

12. The semiconductor device according to claim 8, wherein as measured in a direction orthogonal to the gate width, the high-concentration region has a width, which is the same as a width of the contact region, and is entirely arranged under the contact region.

* * * * *